United States Patent [19]

Thams

[11] 4,321,290
[45] Mar. 23, 1982

[54] PROCESS FOR COATING A METAL ARTICLE ON AND AT AN EDGE

[76] Inventor: Johan-Petter B. Thams, 69, Grönviksvägen, S-161 40 Bromma, Sweden

[21] Appl. No.: 99,754

[22] Filed: Dec. 3, 1979

[30] Foreign Application Priority Data

Dec. 5, 1978 [SE] Sweden ............................. 7812499

[51] Int. Cl.³ .......................... B05D 3/12; B05D 3/10
[52] U.S. Cl. ................................. 427/289; 204/15; 204/29; 204/32 R; 204/35 N; 204/38 E; 204/181 R; 427/270; 427/290; 427/292; 427/299; 427/307; 427/401; 427/445
[58] Field of Search ............... 427/307, 270, 299, 401, 427/445, 289, 290, 292; 204/29, 14, 15, 32 R, 35 N, 38 E

[56] References Cited

U.S. PATENT DOCUMENTS

| | | | |
|---|---|---|---|
| 813,618 | 2/1906 | Chapman et al. | 427/289 |
| 3,591,414 | 7/1971 | Kono et al. | 427/289 |
| 3,682,785 | 8/1972 | Russo | 427/307 |

*Primary Examiner*—Michael R. Lusignan
*Assistant Examiner*—Janyce A. Bell
*Attorney, Agent, or Firm*—Cushman, Darby & Cushman

[57] ABSTRACT

A metal article is coated on and at an edge thereof where at least two planar surfaces meet. The coating is carried out by initially coating the article at least partially at and on the edge, one surface at the edge is freed from coating in a mechanical way or an edge and a surface free from coating is prepared simultaneously in a mechanical way, as e.g. cutting off or sawing off part of the article. The exposed metal surface is then etched to form protecting coating projections and the etched surface is selectively coated. The article obtained has excellent and uniform resistant properties all over its surfaces.

9 Claims, 4 Drawing Figures

PROCESS FOR COATING A METAL ARTICLE ON AND AT AN EDGE

This invention is concerned with a process for coating a metal article on and at an edge where at least two planar surfaces meet.

U.S. Pat. No. 4,145,460 teaches a method of fabricating a printed circuit board. The method of this specification comprises forming a patterned etch resist layer on a metal substrate and selectively etching the substrate to form a through hole with non-linear undercut walls. The etched metal substrate having the resist layer thereon is then coated with a dielectric powder to form a dielectric coat on the substrate having a sufficient edge coverage.

Furthermore, it is known to apply liquid paint on articles by brushing, spraying, etc. However, the liquid paint pulls itself away from sharp corners and edges. The coating obtained by applying the liquid paint by this way becomes thinner round the edges and corners than over the rest of the article. This is the case by normal lacquering processes, as for instance by brush painting, spraying, powder spraying, coating through electrophoresis, roller coating, screen printing or electrostatic spraying.

When using a coating to protect an article, as e.g. of metal, against chemical attack, wearing and weathering and other corrosion or to electrically insulate a metal article the protection and electrical insulation at edges including hole and recess edges and corners are less good than on the remaining surfaces of the article due to the thinner coating of paint or lacquer.

This is a problem especially with coated (lacquered) metal sheet materials for use on buildings or machines, or as metal signs and labels, printed wiring boards or other articles where paint or lacquer is applied in liquid or semi-liquid state, for instance when applying a powder which is melted for sintering.

It has now been found that this "edge problem" can be solved and that a perfect protection or insulation of edges and corners can be obtained according to the process of this invention which is simpler and cheaper than the process of U.S. Pat. No. 4,145,460 and which provides an article having excellent and uniform resistant, including corrosion and electrically insulating, properties and which is much broader applicable than that of U.S. Pat. No. 4,145,460.

The new process according to this invention comprises initially at least partially coating the article, mechanically making a surface free from coating at said edge, etching said surface being freed from coating to form a protecting coating projection and selectively coating said edge surface (the surface exposed and freed from coating).

The metal of said metal article must be one which can be etched without etching the coating. The metal can be copper, iron, steel, aluminum or some metal alloy, for instance. The coating is preferably a lacquer, plastic or paint and need not be the same as the one used for the second coating (the selective coating).

In some cases it is preferable to treat first one of the at least two planar surfaces at the edge and then the second (maybe also the third in a third step) by the process according to the invention. This is particularly the case with planar surfaces of thick sheets and articles where all the three dimensions are large.

It is obvious that the coatings are carried out in a manner known per se, which can be determined by the man of the art for each particular case. Thus, the surfaces to be coated must be cleaned, as e.g. mechanically, by treatment in pickling baths, by treatment with degreasing agents or in some other way. The thickness of the coating also is that normally used for obtaining corrosion resistance, electrical insulation or the like. The coating normally has a minimum thickness of 25 $\mu$m (microns). On top of the first coating a second coating of lacquer, adhesive, etc. can be applied, all depending upon the final use of the article; this is known per se.

The invention will be further described with reference to the accompanying drawing in which.

Figure 1A:
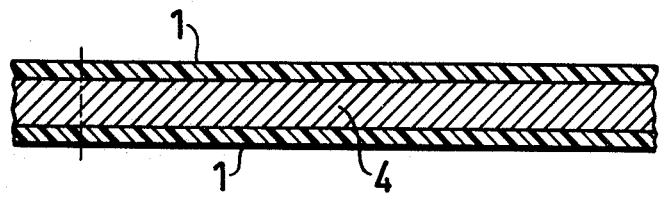
FIG. 1a is a sectional view illustrating one embodiment of the invention.
Figure 1B:
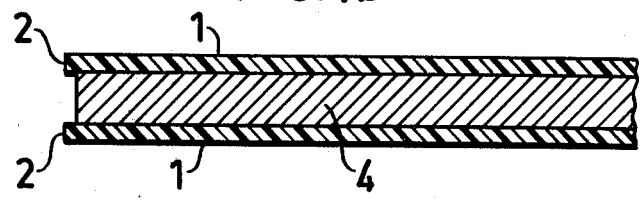
FIG. 1b is a sectional view of the FIG. 1 embodiment after etching.

In FIG. 1a is shown a metal sheet 4 having both main surfaces covered with paint or lacquer or laminated with a plastic layer (sheet or film), these surface layers fulfilling the normal requirements for such surface layers and furthermore being resistant against an etchant (etching agent) or electrolytical etching being capable of dissolving the metal substrate. When the metal sheet has been prepared with two surface layers 1, i.e. when the lacquer or the paint has been dried and hardened (cured), the paint or the lacquer is removed from one of the surfaces at the edge to be treated in order to make an exposed metal surface, i.e. an unprotected metal surface. With an etchant (the selection of which can easily can be done by a man in the art, possibly after making some simple experiments) metal is now etched away from the free metal surfaces so that two projections 2 of the coating and a "ditch" therebetween are formed (FIG. 1b).

Figure 2:
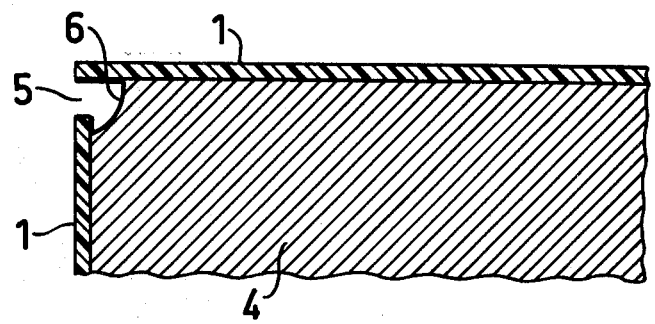
FIG. 2 is a sectional view illustrating another embodiment of the invention.

If the sheet already has the dimensions of the final product, of course, it is also possible to scrape away or to remove the coating from all the surface or from part of the surface (the surface part just adjacent to the edge) at an edge and then etch as mentioned above. If the article to be treated has all the three dimensions large, it is feasible mechanically to remove the coating only on a surface strip just adjacent to the edge and then etch. FIG. 2 shows part of an article 4 with all three dimensions large. A coating is scraped away at 5, whereupon a "ditch" or cavity 6 is etched. The ditch or cavity is then filled with lacquer or paint in a way which is disclosed more in detail referring to FIG. 3. This process can be repeated on other surfaces of the article, so that all edges of the article are treated.

Figure 3:
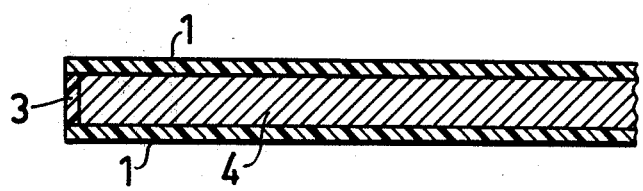
FIG. 3 is a sectional view illustrating the final product obtained according to the embodiment of FIG. 1.

In FIG. 3 is illustrated how the "ditch" has been completely filled with lacquer 3. This filling has been carried out selectively, most preferably by electrophoretic coating. The preferred mode of operation comprises dipping the article having a negative or positive voltage in a coating medium consisting of a dispersion of a lacquer, paint or the like. The deposite obtained in this dipping must be treated in some way to be pore-free, solid, resistant, etc. The edge protection obtained after drying and hardening of the lacquer or paint is at a very high level.

The etchants used in the process according to the invention are known per se. Thus, the metal of the metal substrate can be etched by acids and by basic (alkaline) solutions, as e.g. solutions, preferably aqueous, of alkaline metal hydroxides depending upon the metal chosen. The metal can also be etched by electrolytic etching.

The paint or lacquer coatings can be of the type drying in air, being curable by heat (thermosetting) or being cured by means of catalysts. They are preferably polymer-containing or monomer-containing liquids; for instance, they can comprise so called two-component mixtures forming polymers by polyaddition or monomer mixtures forming polymers, as e.g. polyesters, polyacrylics or polymethacrylics (polyacrylates or polymethacrylates).

If the first coating comprises a plastic layer laminated onto the metal substrate, this layer can comprise any plastic material resisting the etchant used for etching the metal substrate.

The application field of the process according to the invention is broad. For instance, it can be used for treating signs, metal labels or instrument panels to be exposed to chemical or atmospheric environment. It can even be used when preparing panels and metal sheets to be used in making apparatuses, equipments and the like for industrial and private use. If protection through anodising or some other electrolytically deposited protection is not used, but a lacquered surface is desirable, the metal sheet is lacquered or printed on both sides before being mechanically treated; and, for instance, the sign, metal label or panel is cut or blanked to size, holes are punched, pierced or drilled; then, the edges (the minor surfaces) are etched to a suitable depth, exposed metal substrate in the holes also being etched, and then lacquer is applied on the etched surfaces according to the process of the invention.

Since only the exposed parts of the metal substrate can be coated and no coating in this step shall be made on the layers of paint or lacquer such selective processes as electrophoresis (electro-dipping) are used (FIG. 3). During this step the layer (layers) of paint or lacquer must be sufficiently electrically insulated, so that the selectively applied lacquer or paint only is applied on the surfaces exposed. The voltages used during the electrophoresis can be in the range of 50-250 V for a period of time between 0.5 and 5 minutes.

Sheet materials for buildings and the mechanical industry can be treated according to the invention in analogy to the treatment of signs and panels.

With electrical components, as e.g. printed circuits, it is important that the leads are insulated from the substrate and the process of the invention can be applied. Rather than using a metal sheet merely being lacquered before cutting, blanking, milling or drilling it can be coated with an adhesive or laminated onto a substrate with copper film (foiled). After selectively coating the exposed surfaces, for instance by electrophoresis, a pore-free coating is obtained after baking or sintering of the deposit applied by the electrophoresis, for instance.

The invention is illustrated in more detail in the following Examples.

EXAMPLE 1

A metal layer shall be made of a 2 mm iron sheet for a sulfite digester. The label shall resist steam and drops of cooking liquor. To obtain a first class label the iron is first chromatized and then covered by an acrylic base thermosetting paint on both sides. Lettering is printed with a paint of the same type in silkscreen. The metal substrate is machined to size by cutting, blanking or milling and drilled. In this way the metal along the edges and in the holes is exposed.

The iron is now etched on the exposed surfaces to a depth of 35-60 $\mu$m by immersing the metal label in an aqueous solution of 2% by weight of iron-III-chloride and 35% concentrated hydrochloric acid which is strongly agitated to provide a uniform etching. After rinsing, drying and optional pretreatment of the metal exposed the label is selectively coated by electrophoresis in an aqueous dispersion of a clear thermosetting acrylic lacquer. The voltage during the electrophoresis is 50-70 V for the first 50 seconds and then 100-130 V for 2.5 minutes. The edge protection obtained is at least as thick as the lacquer or the paint on the main surfaces.

EXAMPLE 2

To produce a base board for an additively produced printed circuit with a heat sink of 1 mm aluminum base both main sides of an aluminum sheet are lacquered with an acrylic epoxy lacquer in a thickness of 25 $\mu$m; then, both main sides are coated with 25 $\mu$m neopren adhesive suitable for binding of deposited electroless copper.

The panel obtained is drilled and non-circular holes, recesses, etc. are blanked or milled. Then, the panel is immersed in an aqueous, 15% sodium hydroxide solution and the metal is etched away from all exposed section surfaces to a depth of about 30 $\mu$m. After rinsing with water the aluminum base is connected as an anode to 200 V direct current and is then subjected to an electrophoresis in a dispersion of an acrylic epoxy lacquer for 1 minute; the exposed and etched metal parts selectively being coated with lacquer. After rinsing with water and a heat-treatment (in a stove) at 150° C. for 30 minutes all exposed metal surfaces are covered with pore-free lacquer.

An additively produced printed circuit can now be prepared from this panel without any risk of short-circuiting to the aluminum base.

EXAMPLE 3

To produce a panel covered with copper foil to be used as a base for a through-plated substractively produced printed circuit a 1 mm sheet of aluminum is laminated on both main sides with a 0.2 mm epoxy prepeg covered with copper foil. The copper foil is covered with an insulating protective film of 0.1 mm polyvinyl fluoride film having pressure sensitive properties. The panel is drilled, recesses are blanked, milled or roated and the aluminum surfaces thus exposed are etched to a depth of 25-35 $\mu$m by immersion in an aqueous 15% sodium hydroxide solution. The aluminum base is electrically connected as anode to 200 V direct current, subjected to electrophoresis in a dispersion of a thermosetting epoxy lacquer for one minute, rinsed and heat-treated in a stove at 180° for 20 minutes.

By using this panel a through-plated printed surface can be prepared in the normal way known per se.

EXAMPLE 4

The edges (minor surfaces) of lacquered metal sheets for cars and domestic apparatuses (housekeeping devices, white wares) cannot easily be protected against corrosion, such as rusting. To obtain the best results the construction details of sheet now often are lacquered after mechanical machining.

A 0.7 mm iron sheet is lacquered in the desired colour with a baking enamel of alkyd-melamine, protected with a self-adhesive plastic film and thereafter punched, moulded (shaped) and drilled, whereupon the detail is immersed in an aqueous solution of 15% by weight of ammonium persulfate and 1% of peroxide of hydrogene to etch the metal having been exposed. After etching the detail is rinsed and subjected to an electrophoresis at 120 V direct current for 2 minutes in a dispersion of a clear melamine resin to deposit the melamine resin on the edges, which after baking at 120° C. for 20 minutes are completely protected.

EXAMPLE 5

There are problems with the use of lacquered sheets as facade coverings on buildings due to attacks on the sheet edges by weathering (moisture, wind, etc.).

A facade sheet can be prepared by cutting, shaping and piercing large 1 mm aluminum sheets having been prelacquered with acrylic resin or silicone resin; the blanked sheet is immersed in an aqueous 15% sodium hydroxide solution for 20 minutes and after rinsing an acrylic resin is applied on the surfaces exposed by electrophoresis at 120 V for 2 minutes. After baking at 160° C. for 20 minutes the edges (minor surfaces) are completely protected with a uniform resin (plastic) layer.

What is claimed is:

1. A process for coating a metal article on and at an edge where at least two planar surfaces meet to prepare an article having excellent and uniform resistant properties all over its surfaces, said article initially being at least partially coated with a material selected from the group consisting of polymeric materials and polymerizable materials comprising mechanically removing said initial coating from one of said at least two planar surfaces at said edge, etching said surface which is free from coating to form a protecting coating projection and coating said etched surface, but not the initial coating, with a material selected from the group consisting of polymeric materials and polymerizable materials.

2. A process for coating a metal article on and at an edge where at least two planar surfaces meet to prepare an article having excellent and uniform resistant properties all over its surfaces, said article initially being at least partially coated with a material selected from the group consisting of polymeric materials and polymerizable materials, comprising mechanically simultaneously forming said edge and surface which is free from coating by removing a portion of the article, etching said surface which is free from coating to form a protecting coating projection and coating said etched surface, but not the initial coating, with a material selected from the group consisting of polymeric materials and polymerizable materials.

3. The process of claim 1, wherein said mechanically removing of the initial coating is made by shaving or scraping the coating.

4. The process of claim 2, wherein said edge and said surface free from coating is prepared by cutting off or sawing off part of the article.

5. The process of claim 2, wherein said edge and said surface free from coating is prepared by drilling or punching.

6. The process of any one of claims 1 to 5, wherein the article is a metal sheet or plate.

7. The process of any one of claims 1 to 5, wherein said coating of the surface etched is made by electrophoresis.

8. A process for coating a metal article on and at an edge where at least two planar surfaces meet to prepare an article having excellent and uniform resistant properties all over its surfaces, said article initially being at least partially coated with a material selected from the group consisting of polymeric materials and polymerizable materials, comprising mechanically removing said initial coating from one of said at least two planar surfaces at said edge, etching said surface which is free from coating to form a protecting coating projection and coating essentially only said etched surface with a material selected from the group consisting of polymeric materials and polymerizable materials.

9. A process for coating a metal article on and at an edge where at least two planar surfaces meet to prepare an article having excellent and uniform resistant properties all over its surfaces, said article initially being at least partially coated with a material selected from the group consisting of polymeric materials and polymerizable materials, comprising mechanically simultaneously forming said edge and surface which is free from coating by removing a portion of the article, etching said surface which is free from coating to form a protecting coating projection and coating essentially only said etched surface with a material selected from the group consisting of polymeric materials and polymerizable materials.

* * * * *